(12) United States Patent
Kim

(10) Patent No.: US 9,142,283 B2
(45) Date of Patent: Sep. 22, 2015

(54) CIRCUIT FOR SMALL SWING DATA LINE AND METHOD OF OPERATING THE SAME

(71) Applicant: SK hynix Inc., Icheon-si (KR)

(72) Inventor: Youn Cheul Kim, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 66 days.

(21) Appl. No.: 14/146,613

(22) Filed: Jan. 2, 2014

(65) Prior Publication Data

US 2015/0187408 A1    Jul. 2, 2015

(51) Int. Cl.
*G11C 7/10* (2006.01)
*G11C 11/4093* (2006.01)
*G11C 11/4074* (2006.01)

(52) U.S. Cl.
CPC ........ *G11C 11/4093* (2013.01); *G11C 11/4074* (2013.01)

(58) Field of Classification Search
CPC .......................... G11C 7/1051; G11C 7/1078
USPC ............................................. 365/189.05, 239
See application file for complete search history.

(56) References Cited

U.S. PATENT DOCUMENTS

| 7,095,668 | B2 | 8/2006 | Cho |
| 7,151,703 | B2 | 12/2006 | Lee et al. |
| 7,821,857 | B2 | 10/2010 | Kim |
| 8,363,497 | B2 | 1/2013 | Lee |
| 2014/0368236 | A1* | 12/2014 | Chromczak ............... 326/41 |

* cited by examiner

*Primary Examiner* — Huan Hoang
(74) *Attorney, Agent, or Firm* — Kilpatrick Townsend & Stockton LLP

(57) ABSTRACT

A circuit includes a first buffer configured to provide data on a signal line. The first buffer may be powered by a first power supply voltage. The circuit further includes a tri-state buffer coupled to receive the data provided on the signal line. The tri-state buffer may be powered by a second power supply voltage that has a magnitude greater than that of the first power supply voltage. During operation, the tri-state buffer may be activated for a predetermined period of time during which data is made available on the signal line.

10 Claims, 8 Drawing Sheets

CIRCUIT FOR SMALL SWING DATA LINE AND METHOD OF OPERATING THE SAME

BACKGROUND

Various embodiments disclosed herein relate generally to semiconductor technology and, more particularly, to a circuit for small swing data line and a method of operating the same.

In semiconductor integrated circuits, it is not uncommon for some internal interconnect lines to be highly capacitive. Such interconnect lines can be highly capacitive because they interconnect a large number of circuit elements, such as transistors, together, and also may extend long distances and over other elements that can further increase the capacitance on these lines. Often times, such highly capacitive interconnect lines are in the critical data path and need to be switched at high speeds. Switching such high capacitive lines at high frequencies can cause significant increases in dynamic power consumption and cause degradation of internal supply voltages (e.g., by causing ground bounce). Additionally, switching such highly capacitive lines between the supply rails at high speeds requires proper buffering and sizing of driver circuits which in turn can lead to even greater power consumption and further degradation of internal supply voltages.

One such integrated circuits that internally transmits data on highly capacitive interconnect lines is a DRAM (Dynamic Random Access Memory). A DRAM is a type of volatile memory that includes memory cells, each of which is composed of a transistor and a capacitor to store data. Data input/output operations as basic functions of a DRAM cell are carried out by turning on/off a word line serving as a gate input to a transistor in the DRAM cell.

The memory cell region in a memory device is typically divided into a plurality of banks. Data stored in each cell is read by transferring the cell data amplified by an IO (Input/Output) sense amplifier to a DQ block via a global IO line. Write data is written to a memory cell by transferring externally provided data input through a DQ block to a write driver via a global IO line and then storing the transferred data in the memory cell. Global IO lines, which are in the critical data path, interconnect many circuit elements and extend over long distances, and as such are highly capacitive.

As the demand continues to rise for highly integrated ICs (such as memory devices) that are capable of operating at higher speeds while consuming less power, achieving these two competing goals becomes increasing more difficult. Further, as operating speeds of highly integrated ICs increases, degradation of internal power supply lines becomes more pronounced. Thus, techniques that improve operating speeds, reduce power consumption, and improve upon the internal supply degradations are highly desirable.

BRIEF SUMMARY

In accordance with one embodiment, a circuit includes a first buffer configured to provide data on a signal line. The first buffer may be powered by a first power supply voltage. The circuit further includes a tri-state buffer coupled to receive the data provided on the signal line. The tri-state buffer may be powered by a second power supply voltage that has a magnitude greater than that of the first power supply voltage. During operation, the tri-state buffer may be activated for a predetermined period of time during which data is made available on the signal line.

In one variation, a burst of at least two data items may be sequentially provided by the first buffer on the signal line, and the tri-state buffer may be activated for the entire burst duration.

In another variation, a burst of at least two data items may be sequentially provided by the first buffer on the signal line, and the tri-state buffer may be activated only during the time each data item in the burst is made available on the signal line.

In another variation, the tri-state buffer receives a control signal that places the tri-state buffer in hi-z state when the control signal is in inactive state, and places the tri-state buffer in active state when the control signal is in active state.

In accordance with another embodiment, a circuit includes a first buffer coupled to provide data on a signal line, and a tri-state buffer coupled to receive the data provided on the signal line, wherein a method of operating the circuit includes: powering the first buffer by a first power supply voltage, powering the tri-state buffer by a second power supply voltage having a magnitude greater than that of the first power supply voltage, and activating the tri-state buffer for a predetermined period of time during which data is provided by the first driver on the signal line.

In one variation, the method further includes sequentially providing at least two data items in a data burst on the signal line, and activating the tri-state buffer for the entire burst duration.

In another variation, the method further includes sequentially providing at least two data items in a data burst on the signal line, and activating the tri-state buffer only during the time each data item in the burst is made available on the signal line.

DETAILED DESCRIPTION

Figure 1:
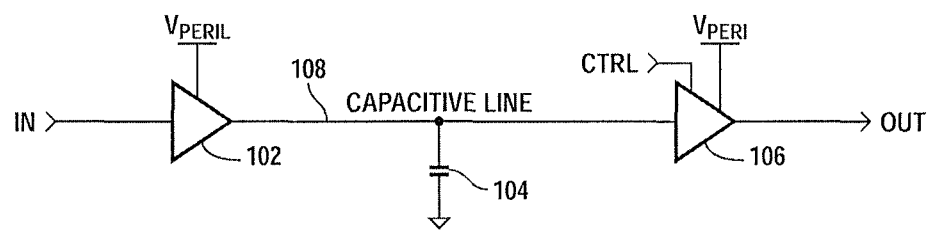
FIG. 1 is a circuit diagram illustrating the small swing data line technique in accordance with one embodiment.

Hereinafter, various embodiments will be described with reference to the accompanying drawings. In the following description, detailed explanation of known related functions and constitutions may be omitted to avoid unnecessarily obscuring the subject matter of the present invention. Like reference numerals refer to like elements throughout the specification and drawings.

Figure 2:
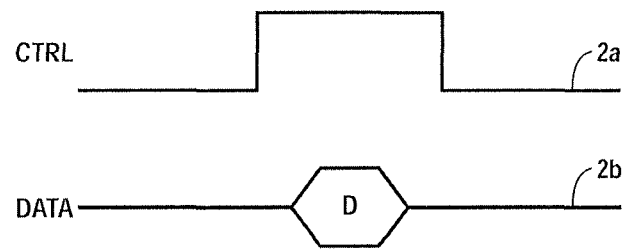
FIG. 2 is a timing diagram used in conjunction with the circuit diagram in FIG. 1 to describe the small swing data line technique in accordance with one embodiment.

The circuit diagram in FIG. 1 and the timing diagram in FIG. 2 will be used to describe a small swing data line technique that reduces power consumption and improves operating speeds and internal supply degradations, in accordance with one embodiment. In FIG. 1, first buffer 102 receives input signal IN with its output coupled to drive a line with a high capacitive load 104. Capacitive load 104 may include parasitic capacitance associated with, for example, transistor gates and transistor diffusion regions that are connected to line 108, as well as the capacitance associated with line 108 itself which may be made of metal or other conductors that extend long distances. Tristate buffer 106 is coupled to receive the signal generated by first buffer 102 on capacitive line 108. Tri-state buffer 106 is also coupled to receive tri-state control signal Ctrl. Control signal Ctrl serves to place tri-state buffer 106 in active state when control signal Ctrl is in an active state, and place tri-state buffer 106 in hi-z state when Ctrl is in an inactive state.

The circuit in FIG. 1 is configured so that capacitive line 108 is driven by a buffer, first buffer 102, that is powered by a low periphery supply voltage $V_{PERIL}$ which is lower in magnitude than the periphery supply voltage $V_{PERI}$ that powers other circuit elements, including tri-state buffer 106. In one example where an externally provided supply voltage is 1.8V, $V_{PERI}$ is 1.5V and $V_{PERIL}$ is 1.3V. Both $V_{PERI}$ and $V_{PERIL}$ may be derived from the externally provided supply voltage using, for example, on-chip voltage generators. Of course, other voltage magnitudes are possible for each of the three supply voltages depending on the design goals and constraints. Alternatively, the externally provided supply voltage can serve as $V_{PERI}$.

Powering first buffer 102 with the low periphery supply voltage $V_{PERIL}$ results in a lower voltage swing on line 108 as compared to other circuit nodes, thus reducing the power consumption and improving the signal integrity and propagation speed. Given the highly capacitive nature of line 108, by limiting the signal swing on such lines, the power dissipated due to switching of the capacitive lines is reduced. And, because the signal swing is less, the signal transitions on these lines are faster.

A drawback of the circuit in FIG. 1 is that tri-state buffer 106 consumes power whenever capacitive line 108 is in the high state. The power consumption is as a result of all transistors in tri-state buffer 106 being fully or partially on when capacitive line 108 is in the high state. However, the amount of power consumed by tri-state buffer 106 is substantially reduced by limiting the time during which tri-state buffer 106 is in active state. This is described more fully with reference to the timing diagram in FIG. 2.

FIG. 2 shows waveforms for control signal Ctrl that controls tri-state buffer 106 and the data signal on capacitive line 108. When control signal Ctrl is in inactive state (in FIG. 2, the inactive state corresponds to the low state), tri-state buffer 106 is placed in hi-z state (i.e., it becomes non-responsive to signal changes on capacitive line 108). When control signal Ctrl is in active state, tri-state buffer 106 becomes responsive to signal changes on capacitive line 108.

When the data on capacitive line 108 is in a high state (i.e., is at $V_{PERIL}$), tri-state buffer 106 consumes power only during the time that control signal Ctrl is in active state. When control signal Ctrl is in inactive state, tri-state buffer 106 is placed in hi-z state and thus does not consume any power. In one embodiment, tri-state buffer is placed in active state only during the time period valid data is made available on capacitive line 108 by buffer 102. Alternatively, valid data may be provided on capacitive line 108 for a longer period than the period control signal Ctrl is in active state. It is noted that the increase in dynamic power consumption due to tri-state buffer 106 conducting current when capacitive line 108 is in the high state is far less than the reduction in the power consumption that is achieved as a result of limiting the signal swing on highly capacitive lines. This is particularly the case in ICs that switch highly capacitive interconnect lines during operation.

Because of the tri-state nature of buffer 106, latches (not shown in FIG. 1) can be used at the output of tri-state buffer 106 to ensure that the data at its output is not lost when tri-state buffer 106 is subsequently placed in tri-state. First buffer 102 can be any logic gate that serves the purpose of driving a capacitive line. For example, buffer 102 may be an inverter, a NOR gate or a NAND gate, depending on the circuitry in which it is implemented. Similarly, tri-state buffer 106 may be any logic gate capable of being placed in hi-z state.

Figure 3:
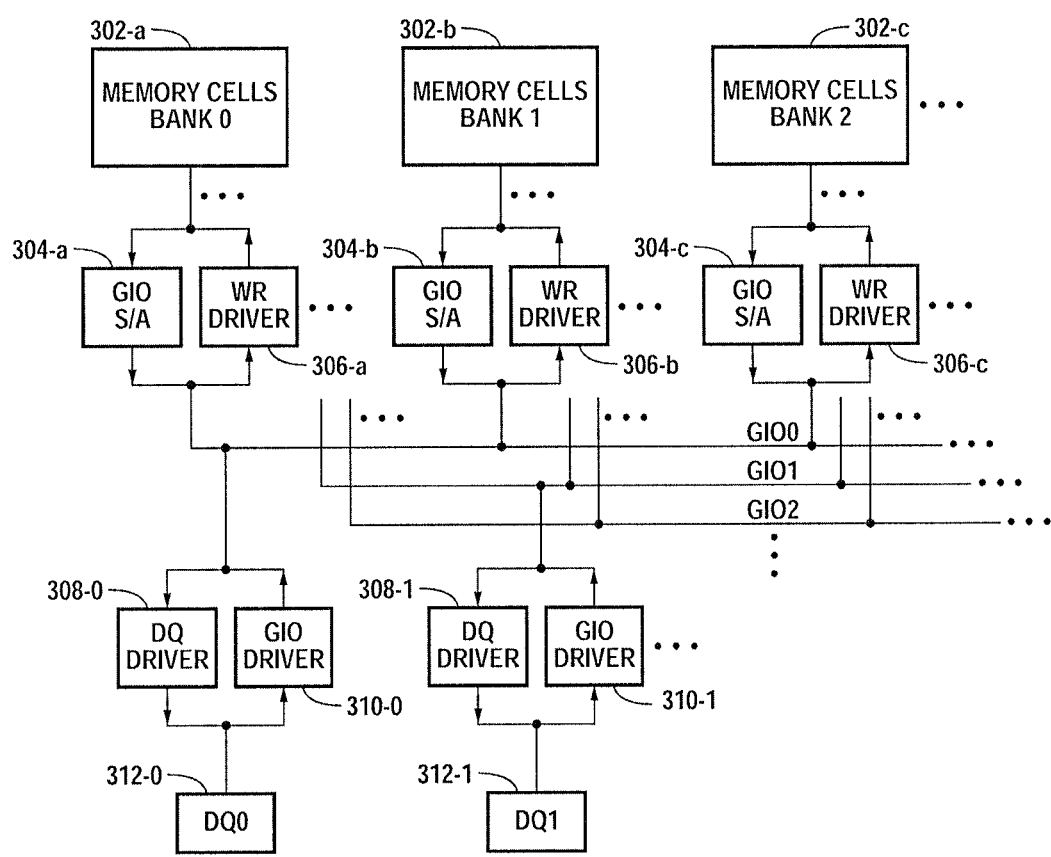
FIG. 3 is a schematic diagram of a memory device illustrating an exemplary application in which the small swing data line concept depicted in FIGS. 1 and 2 is implemented.

FIG. 3 is a schematic diagram illustrating an exemplary application in which the small swing data line concept depicted in FIGS. 1 and 2 is implemented. FIG. 3 shows the configuration of a semiconductor memory device that includes global IO lines GIO_0, GIO_1, etc., with a low-amplitude voltage signal applied thereto. Each of these global IO lines is connected to many circuit blocks, and extends over long distances. As such these global IO lines are highly capacitive, and thus contribute significantly to power consumption and noise during operation. The small voltage swing date line concept described above is used to significantly reduce both the power consumption and the noise generated by switching of these global IO lines, as well to improve the signal propagation delay.

The semiconductor memory device in FIG. 3 includes a plurality of memory banks 302-a, 302-b, 302-c, etc. . . . Each memory bank may be coupled to a plurality of pairs of circuit blocks GIO S/A 304 and WR driver 306. Each pair of circuit blocks GIO S/A 304 and WR driver 306 may be coupled to a global IO line. It is noted that each global IO line may include a plurality of signal lines. The global IO lines are in turn coupled to a plurality of pairs of circuit blocks DQ driver 308 and GIO driver 310. The plurality of pairs of circuit blocks DQ driver 308 and GIO driver 310 are in turn coupled to DQ pads 312.

The circuit blocks GIO S/A 304 and DQ driver 308 serve to provide selected cell data to the DQ pins in a read operation, and circuit blocks GIO driver 310 and WR driver 306 serve to deliver write data provided on DQ pins to selected memory cells in a write operation. The small swing data line concept described above is implemented in these circuit blocks the details of which are shown in FIG. 4.

Figure 4:
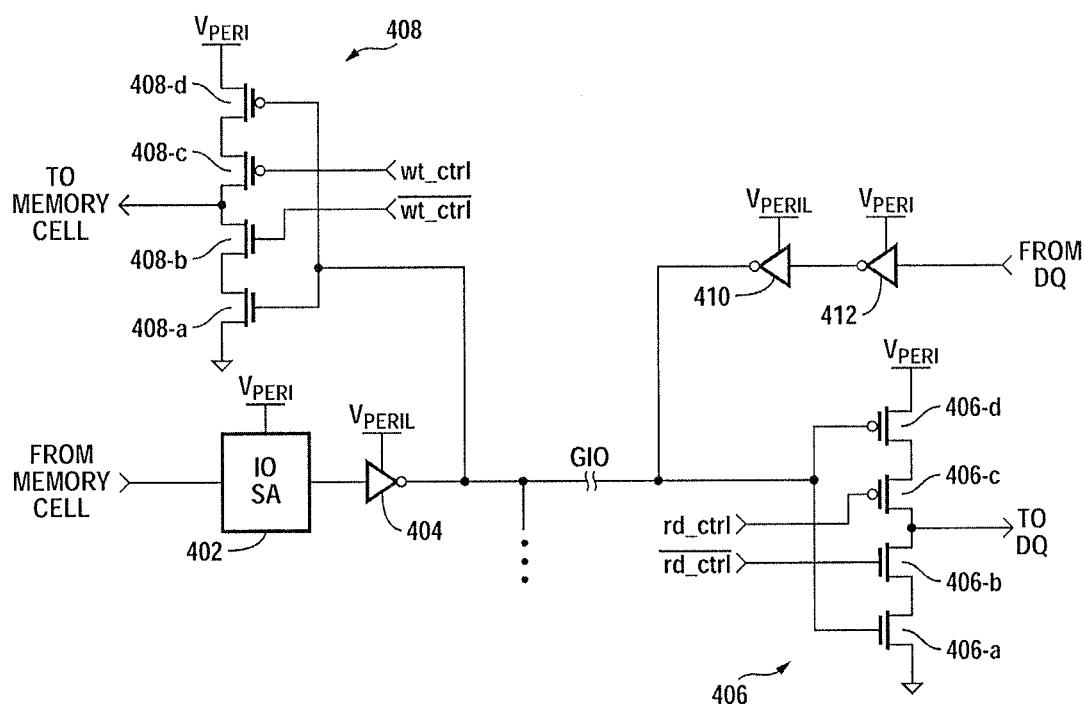
FIG. 4 shows circuit implementation of some of the blocks in the FIG. 3 schematic diagram, in accordance with one embodiment.

FIG. 4 shows circuit details of a portion of each of DQ driver 308, GIO driver 310, GIO S/A 304 and WR driver 306 in FIG. 3. In FIG. 4, IO S/A 402 and inverter 404 form part of GIO S/A 304. Tri-state buffer 406 forms part of DQ driver 308. Inverters 410 and 412 form part of GIO driver 310, and tri-state buffer 408 forms part of WR driver 306. Similar to the circuit in FIG. 1, the circuits in FIG. 4 are configured so that each global IO line GIO is driven with a circuit that is powered by a low periphery supply voltage $V_{PERIL}$ that is lower in magnitude than the periphery supply voltage $V_{PERI}$ that powers other peripheral circuits. In one example where the externally provided supply voltage is 1.8V, $V_{PERI}$ is 1.5V and $V_{PERIL}$ is 1.3V. In this example, both $V_{PERI}$ and $V_{PERIL}$ are derived from the externally provided supply voltage (e.g., on-chip voltage generators generate $V_{PERI}$ and $V_{PERIL}$ from the externally supply voltage). Of course, other voltage magnitudes are possible for each of the three supply voltages depending on the design goals and constraints. Alternatively, the externally provided supply voltage can serve as $V_{PERI}$.

Powering the circuits that drive global IO line GIO with the low periphery supply voltage $V_{PERIL}$ results in a lower voltage swing on global IO line GIO, thus reducing the power consumption and improving the signal integrity and propagation speed. The circuits that drive global IO line GIO include inverters 404 and 410, and as can be seen, both inverters are powered by $V_{PERIL}$. Given the highly capacitive nature of GIO line, by limiting the signal swing on these lines, the power dissipated by the GIO lines is reduced. Further, because the signal swing is less, the signal transitions on these lines are faster.

A drawback of the circuitry in FIG. 4 is that those circuit elements that receive the signal on the GIO lines consume power because these circuit elements are powered by the periphery supply voltage $V_{PERI}$ which is greater in magnitude than the high level of the signals on the GIO lines. The circuit elements that receive the signals on GIO lines are tri-state buffers 406 and 408. These two tri-state buffers conduct current whenever the GIO line to which they are connected is in the high state. However, the amount of power consumed by tri-state buffers 406 and 408 when their respective GIO lines is in the high state is substantially reduced by minimizing the amount of time the corresponding GIO signals remain high during operation. This is described more fully with reference to the timing diagrams in FIGS. 5 and 6.

Figure 5:
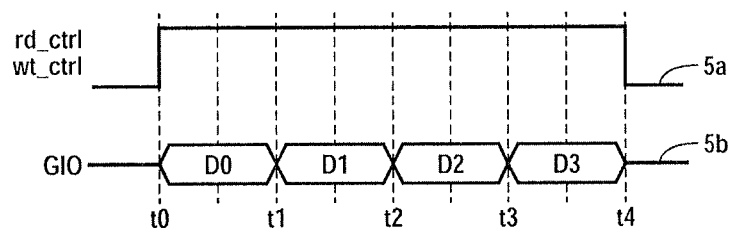
FIGS. 5 and 6 are timing diagrams used in conjunction with the circuit diagram in FIG. 4 to describe two different operational embodiments.
Figure 6:
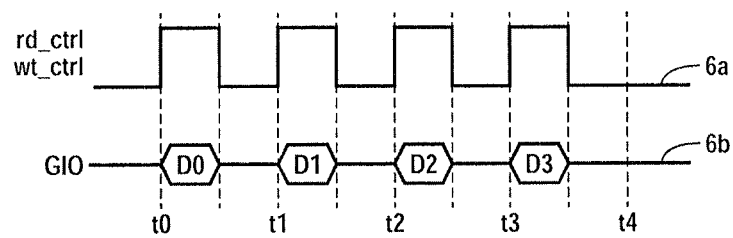

FIGS. 5 and 6 show waveforms for control signals that control tri-state buffers 406 and 408 (among other circuitry), and also show data signals on the GIO lines, for two different embodiments. The FIG. 5 waveforms correspond to one embodiment, and the FIG. 6 waveforms correspond to another embodiment. In FIG. 5, waveform 5a represents both the read control signal (rd_ctrl) that controls tri-state buffer 406 and the write control signal (wr_ctrl) that controls tri-state buffer 408. Similarly, in FIG. 6, waveform 6a represents both the read control signal (rd_ctrl) that controls tri-state buffer 406 and the write control signal (wr_ctrl) that controls tri-state buffer 408. In both FIGS. 5 and 6, one waveform is shown for the two control signals for simplicity. Read control signal rd_ctrl and its complementary signal (shown in FIG. 4 but not in FIGS. 5 and 6) control the operation of tri-state buffer 406, and write control signal wt_ctrl and its complementary signal (shown in FIG. 4 but not in FIGS. 5 and 6) control the operation of tri-state buffer 408. When rd_ctrl and wt_ctrl signals are in inactive state (in FIGS. 5 and 6, the inactive state corresponds to the low state), the corresponding tri-state buffers are placed in hi-z state (i.e., they become non-responsive to changes on GIO lines). When rd_ctrl and wt_ctrl signals are in active state, the corresponding tri-state buffers become responsive to changes on GIO lines.

The FIG. 5 waveforms represent an embodiment in which the read and write control signals are held in active state for the duration that a burst of data (depicted in FIG. 5 as data D0, D1, D2 and D3) is transmitted through GIO lines (in the FIG. 5 embodiment, a burst of 4 data is shown but other bursts are also possible). In this embodiment, when the data on GIO line is at a high level (i.e., is at $V_{PERIL}$), tri-state buffers 406 and 408 consume dynamic power during the time that the read or write control signals are active. When the read or write control signals are in inactive state, tri-state buffers 406 and 408 are placed in hi-z state and thus do not consume any power. It is noted that the increase in dynamic power consumption due to the current flowing through these tri-state buffers when their respective inputs is in the high state is far smaller than the reduction in power consumption that is achieved as a result of limiting the signal swing on the GIO lines.

The FIG. 6 embodiment provides additional reduction in power consumption as compared to the FIG. 5 embodiment by activating the tri-state buffers only during time periods when each data in the burst of data needs to remain valid on the GIO lines. This can be seen more clearly by comparing waveform 5a which shows the read/write control signal being kept in active state during the entire data burst operation to waveform 6a which shows the read/write control signal being active only during periods when each data in the data burst needs to remain valid. In this manner, the dynamic power consumed by tri-state buffers 406 and 408 in the embodiment depicted by FIG. 5 is potentially cut at least in half by the FIG. 6 embodiment. It is noted that because of the tri-state nature of buffers 406 and 408, clocked latches can be used at the outputs of these tri-state buffers to ensure that the data at their outputs is not lost when the tri-state buffers are in hi-z state.

While the embodiments depicted by FIGS. 4-6 show power consumption improvement achieved in the context of transfer of bursts of data, the same power consumption advantages can be achieved in circuits where only one piece of data is transferred on a highly capacitive signal line. Also, while FIG. 4 shows one implementation of a tri-state buffer for buffers 406 and 408, other known implementations of tri-state buffers may also be used.

Figure 7A:
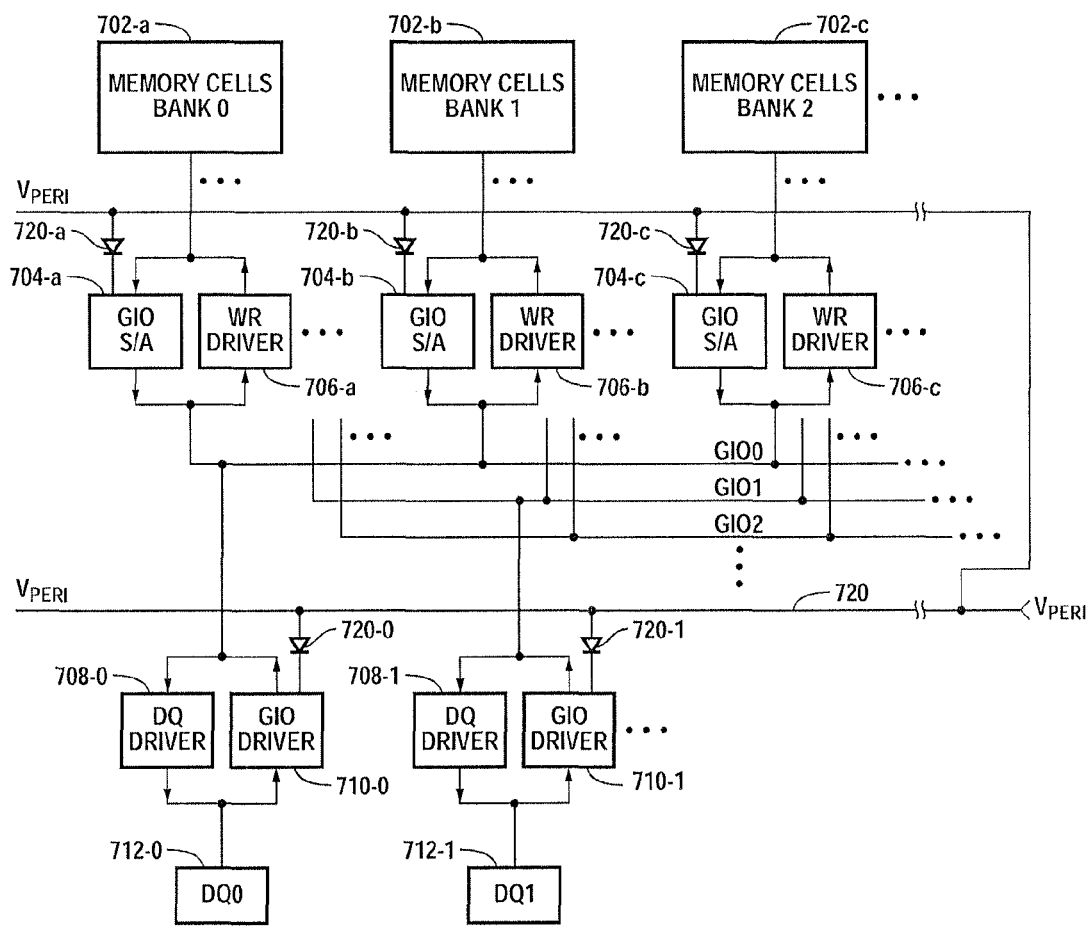
FIGS. 7A and 7B are circuit diagrams that depict an exemplary embodiment in which the power supply voltage provided to the drivers of the highly capacitive lines is dropped through diodes.
Figure 7B:
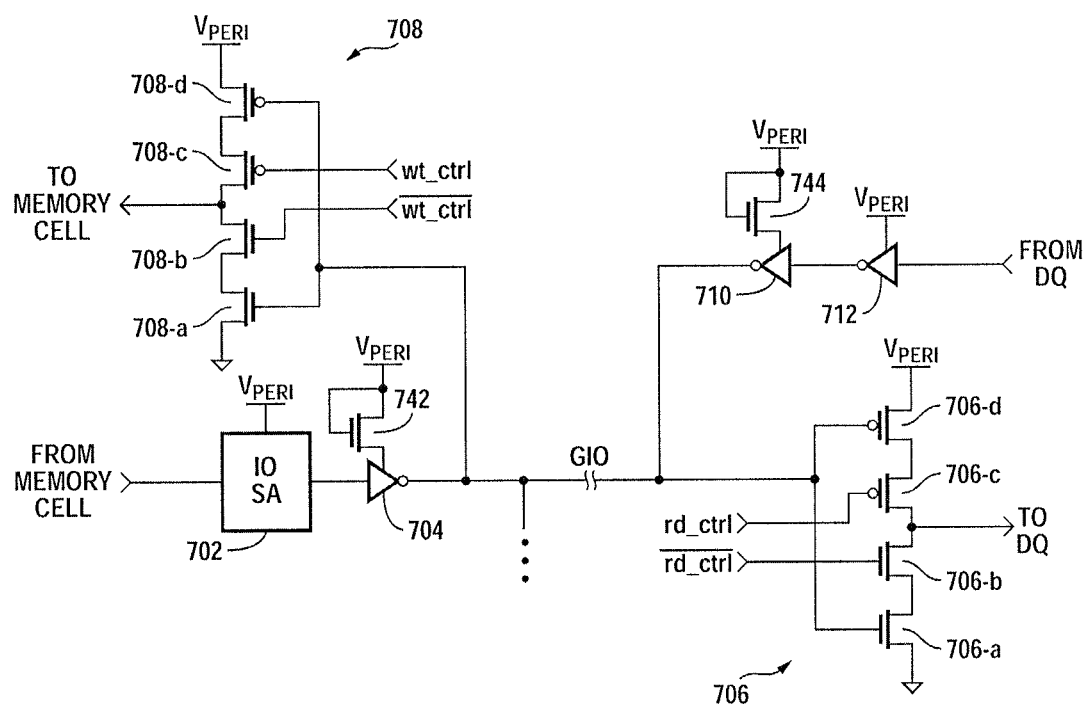

FIGS. 7A and 7B are circuit diagrams that depict an exemplary embodiment in which the power supply voltage provided to the drivers of the highly capacitive GIO lines (e.g., drivers 704 and 710 in FIG. 7B) is dropped through diodes (e.g., diodes 720a, 720b, 720c, 720-0 and 720-1 in FIG. 7A and diodes 742 and 744 in FIG. 7B) rather than through a voltage generator that directly provides low periphery supply voltage $V_{PERIL}$ to the GIO line drivers. Each of diodes 720a, 720b, 720c, 720-0 and 720-1 in FIG. 7A is local to a corresponding GIO line driver, as more clearly depicted by diodes 742 and 744 in FIG. 7B.

FIG. 7B shows circuit details of a portion of each of DQ driver 708, GIO driver 710, GIO S/A 704 and WR driver 706 in FIG. 7A. In FIG. 7B, IO S/A 702 and inverter 704 form part of GIO S/A 704. Tri-state buffer 706 forms part of DQ driver 708. Inverters 710 and 712 form part of GIO driver 710, and tri-state buffer 708 forms part of WR driver 706. As can be seen, FIGS. 7A and 7B are substantially similar to FIGS. 3 and 4, respectively, except that the periphery supply voltage $V_{PERI}$ is provided to the drivers of GIO lines through local diodes (e.g., diodes 720a, 720b, 720c, 720-0 and 720-1 in FIG. 7A, and diodes 742 and 744 in FIG. 7B). These diodes drop the internal power supply $V_{PERI}$ down (by one diode drop) and provide the lower supply voltage to corresponding GIO line drivers. In this manner, the signal swing on the highly capacitive GIO lines is advantageously reduced (similar to that in the FIG. 4 embodiment).

Additionally, the diode technique depicted by the FIGS. 7A, 7B embodiment eliminates the need for the on-chip voltage generator for generating the low internal supply voltage $V_{PERIL}$. Also, the diodes advantageously limit the voltage drop on the internal power supply lines that carry supply voltage $V_{PERI}$ due to any unexpected excess current being drawn by the GIO line drivers during operation. This is particularly important in applications where there is little head room between the external supply voltage and the transistor threshold voltages. For example, in applications where the external supply voltage is 1.2V and the threshold voltages of the NMOS/PMOS transistors are +/−0.4V, there is only 0.4V head room for safe operating conditions. The diodes advantageously limit the current drawn by the GIO line drivers thus ensuring that the internal supply voltage (e.g., $V_{PERI}$) remains within safe window of operation.

In one embodiment, diodes 720a, 720b, 720c, 720-0 and 720-1 are sized to ensure that sufficient current can be supplied to corresponding GIO line drivers for proper operation while limiting any large currents that may be drawn by the GIO line drivers due to unexpected operating conditions. Also, the diodes can be implemented using diode-connected transistors. For example, in FIG. 7B, the diodes are implemented using diode-connected NMOS transistors 742, 744. However, the diodes can also be implemented using diode-connected PMOS transistors.

Figure 8A:
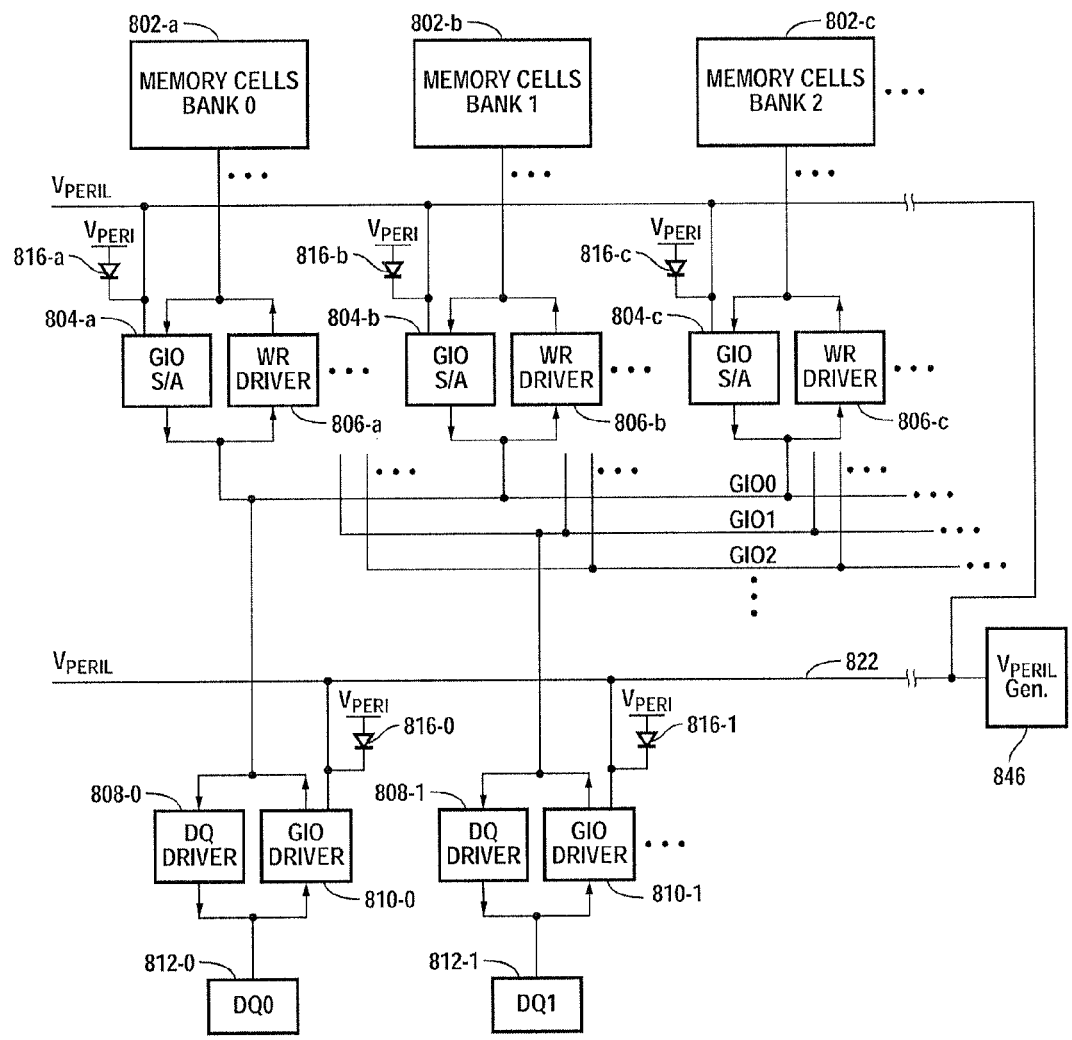
FIGS. 8A and 8B are circuit diagrams that depict yet another exemplary embodiment which is identical to the embodiment depicted by FIGS. 3 and 4 except that a diode is locally provided for each driver of the highly capacitive lines.
Figure 8B:
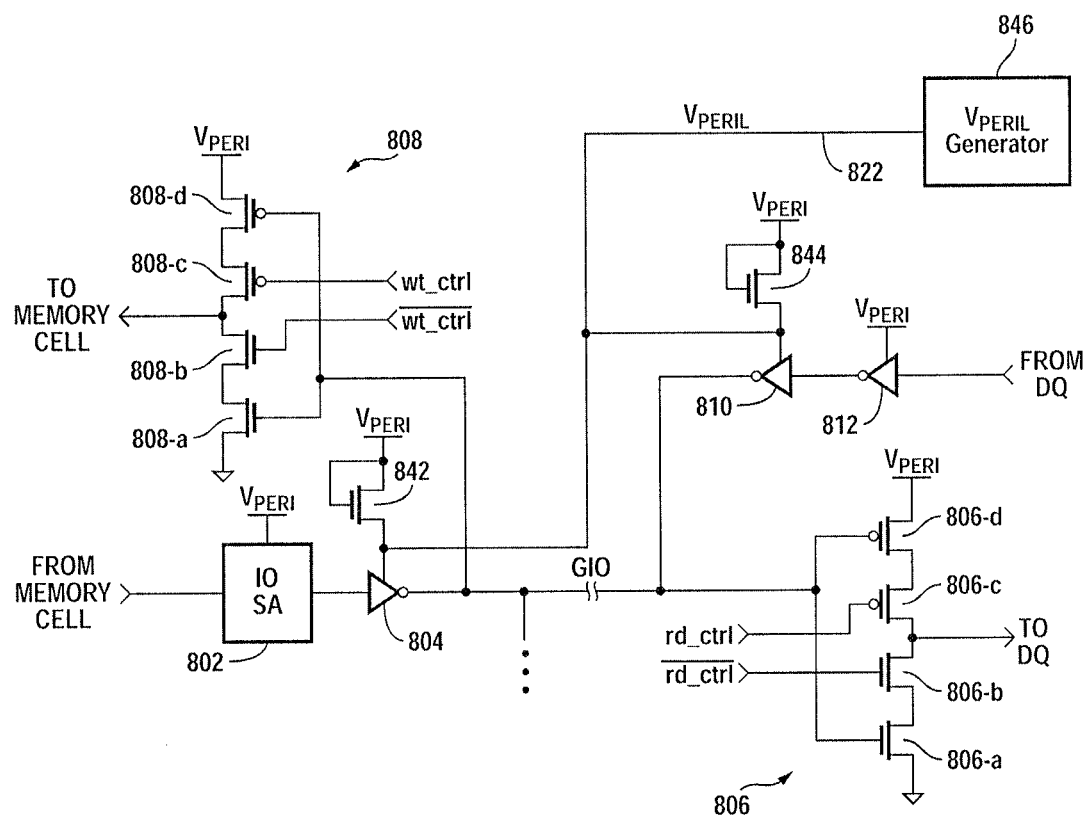

FIGS. 8A and 8B are circuit diagrams that depict yet another exemplary embodiment which is identical to the embodiment depicted by FIGS. 3 and 4 except that a diode is locally provided for each GIO driver. These diodes (i.e., diodes 816a, 816b, 816c, 816-0 and 816-1 in FIG. 8A, and diodes 842 and 844 in FIG. 8B) are connected between $V_{PERI}$ and $V_{PERIL}$, and serve to prevent $V_{PERIL}$ from dropping too low in the event unexpectedly large currents are drawn by the GIO line drivers. When a GIO driver draws an unexpectedly large amount of current that $V_{PERIL}$ generator cannot immediately supply (e.g., because the amount of the drawn current is larger than what $V_{PERIL}$ generator is designed to supply, or because of voltage drop in $V_{PERIL}$ line that supplies power to the GIO driver), the corresponding local diode operates a "helper" to supply current from $V_{PERI}$ to the GIO driver. This prevents $V_{PERIL}$ from fluctuating or dropping too low. Fluctuations or drops in the level of $V_{PERIL}$ can compromise device operation by, for example, causing delays in GIO signals. In one embodiment, to ensure the diodes function as intended, they are designed to ensure the following relationship is satisfied: $V_{PERI} \leq V_{PERIL}+Vth$, where Vth represents the diode threshold voltage.

FIG. 8B shows circuit details of a portion of each of DQ driver 808, GIO driver 810, GIO S/A 804 and WR driver 806 in FIG. 8A. In FIG. 8B, IO S/A 802 and inverter 804 form part of GIO S/A 804. Tri-state buffer 806 forms part of DQ driver 808. Inverters 810 and 812 form part of GIO driver 810, and tri-state buffer 808 forms part of WR driver 806. GIO drivers 804 and 810 can be viewed to include diode-connected transistors 842 and 844, respectively.

The sizes of the diodes in the FIGS. 8A, 8B embodiment can be made smaller than those in the FIGS. 7A, 7B embodiment since in the FIGS. 8A, 8B embodiment, under normal operating conditions, $V_{PERIL}$ generator 846 supplies the needed current for proper operation of the GIO drivers, and the diodes serve more as a "helper" and supply additional current from $V_{PERI}$ when GIO drivers draw unexpectedly large currents.

While the embodiments in FIGS. 7A, 7B and FIGS. 8A, 8B show one local diode per GIO line driver, in alternate embodiments, one diode could be used for multiple GIO line drivers. In such case, the size of each diode may be increased to ensure that sufficient current can be supplied if two or more GIO line drivers in a given group are activated simultaneously.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. A circuit comprising:
    a first buffer configured to provide data on a signal line, the first buffer being powered by a first power supply voltage; and
    a tri-state buffer coupled to receive the data provided on the signal line, the tri-state buffer being powered by a second power supply voltage having a magnitude greater than that of the first power supply voltage, wherein the tri-state buffer is activated for a predetermined period of time during which data is made available on the signal line, wherein a burst of at least two data items are sequentially provided by the first buffer on the signal line, and the tri-state buffer is activated for the entire burst duration.

2. The circuit of claim 1, wherein the tri-state buffer receives a control signal that places the tri-state buffer in hi-z state when the control signal is in inactive state, and places the tri-state buffer in active state when the control signal is in active state.

3. The circuit of claim 2, wherein the first buffer is a read buffer, the tri-state buffer is a read tri-state buffer, and the control signal is a read control signal, the circuit further comprising:
    a write buffer configured to provide data on the signal line, the write buffer being powered by the first power supply voltage; and
    a write tri-state buffer coupled to receive the data provided on the signal line by the write buffer, the write tri-state buffer being powered by the second power supply voltage.

4. The circuit of claim 3, wherein the write tri-state buffer receives a write control signal that places the write tri-state buffer in hi-z state when the write control signal is in inactive state, and places the write tri-state buffer in active state when the write control signal is in active state, the write control signal activating the write tri-state buffer for a predetermined period of time during which data is made available on the signal line.

5. A circuit comprising:
    a first buffer configured to provide data on a signal line, the first buffer being powered supply voltage; and
    a tri-state buffer coupled to receive the data provided on the signal line, the tri-state buffer being powered by a second power supply voltage having a magnitude greater than that of the first power supply voltage, wherein the tri-state buffer is activated for a predetermined period of time during which data is made available on the signal line, wherein a burst of at least two data items are sequentially provided by the first buffer on the signal line, and the tri-state buffer is activated only during the time each data item in the burst is made available on the signal line.

6. A method of operating a circuit having a first buffer coupled to provide data on a signal line, and a tri-state buffer coupled to receive the data provided on the signal line, the method comprising:
    powering the first buffer by a first power supply voltage;
    powering the tri-state buffer by a second power supply voltage having a magnitude greater than that of the first power supply voltage;
    activating the tri-state buffer for a predetermined period of time during which data is provided by the first buffer on the signal line;
    sequentially providing at least two data items in a data burst on the signal line; and
    activating the tri-state buffer for the entire burst duration.

7. The method of claim 6, wherein the tri-state buffer receives a control signal, the method comprising:
    placing the tri-state buffer in hi-z state when the control signal is in inactive state; and
    placing the tri-state buffer in active state when the control signal is in active state.

8. The method of claim 7, wherein the first buffer is a read buffer, the tri-state buffer is a read tri-state buffer, and the control signal is a read control signal, and the circuit further includes a write buffer configured to provide write data on the signal line, and a write tri-state buffer coupled to receive the write data provided on the signal line by the write buffer, the write tri-state buffer receiving a write control signal, the method further comprising:

placing the write tri-state buffer in hi-z state when the control signal is in inactive state; and placing the write tri-state buffer in active state when the control signal is in active state.

9. The method of claim 8 further comprising:

powering the write buffer by the first power supply voltage;

powering the write tri-state buffer by the second power supply voltage; and activating the write tri-state buffer by the write control signal for a predetermined period of time during which data is made available on the signal line.

10. A method of operating a circuit having a first buffer coupled to provide data on a signal line, and a tri-state buffer coupled to receive the data provided on the signal line, the method comprising:

powering the first buffer by a first power supply voltage;

powering the tri-state buffer by a second power supply voltage having a magnitude greater than that of the first power supply voltage;

activating the tri-state buffer for a predetermined period of time during which data is provided by the first driver on the signal line;

sequentially providing at least two data items in a data burst on the signal line; and activating the tri-state buffer only during the time each data item in the burst is made available on the signal line.

* * * * *